(12) United States Patent
Tsai et al.

(10) Patent No.: US 11,398,516 B2
(45) Date of Patent: Jul. 26, 2022

(54) CONDUCTIVE CONTACT FOR ION THROUGH-SUBSTRATE VIA

(71) Applicant: Taiwan Semiconductor Manufacturing Co., Ltd., Hsin-Chu (TW)

(72) Inventors: Min-Ying Tsai, Kaohsiung (TW); Cheng-Ta Wu, Shueishang Township (TW); Yeur-Luen Tu, Taichung (TW)

(73) Assignee: Taiwan Semiconductor Manufacturing Company, Ltd., Hsinchu (TW)

(*) Notice: Subject to any disclaimer, the term of this patent is extended or adjusted under 35 U.S.C. 154(b) by 0 days.

(21) Appl. No.: 16/724,744

(22) Filed: Dec. 23, 2019

(65) Prior Publication Data

US 2021/0066378 A1    Mar. 4, 2021

Related U.S. Application Data

(60) Provisional application No. 62/893,333, filed on Aug. 29, 2019.

(51) Int. Cl.
*H01L 23/48* (2006.01)
*H01L 27/146* (2006.01)
*H01L 21/768* (2006.01)

(52) U.S. Cl.
CPC .... *H01L 27/14634* (2013.01); *H01L 21/7684* (2013.01); *H01L 23/481* (2013.01); *H01L 27/1469* (2013.01); *H01L 27/14636* (2013.01)

(58) Field of Classification Search
CPC ..... H01L 23/48; H01L 23/481; H01L 23/498; H01L 23/522; H01L 23/526;
(Continued)

(56) References Cited

U.S. PATENT DOCUMENTS 9,412,681 B2    8/2016  Tenailleau et al.
2015/0115131 A1    4/2015  Webster et al.
(Continued)

OTHER PUBLICATIONS

Tsuchiya et al. "Electrical Properties and Solid-Phase Reactions in Ni/Si(100) Contacts." Jpn. J. Appl. Phys. vol. 41 (2002) pp. 2450-2454, published Apr. 2002.
(Continued)

*Primary Examiner* — Chuong A Luu
(74) *Attorney, Agent, or Firm* — Eschweiler & Potashnik, LLC

(57) ABSTRACT

Various embodiments of the present disclosure are directed towards an integrated chip including a first through substrate via (TSV) disposed within a semiconductor substrate. The semiconductor substrate has a front-side surface and a back-side surface respectively on opposite sides of the semiconductor substrate. The semiconductor substrate comprises a first doped channel region extending from the front-side surface to the back-side surface. The first TSV is defined at least by the first doped channel region. A conductive contact overlies the back-side surface of the semiconductor substrate and comprises a first conductive layer overlying the first TSV. The first conductive layer comprises a conductive material. An upper conductive layer underlies the conductive contact. An upper surface of the upper conductive layer is aligned with the back-side surface of the semiconductor substrate. The upper conductive layer comprises a silicide of the conductive material.

20 Claims, 11 Drawing Sheets

(58) Field of Classification Search
CPC ............... H01L 23/528; H01L 23/532; H01L 23/53228; H01L 23/53214; H01L 23/5226; H01L 23/49827; H01L 25/18; H01L 27/144; H01L 27/146; H01L 27/14634; H01L 27/14636; H01L 27/1469; H01L 27/14683; H01L 27/14627; H01L 21/265; H01L 21/285; H01L 21/768; H01L 21/7684; H01L 21/76898; H01L 21/28518; H01L 21/00
USPC ...................................................... 257/443
See application file for complete search history.

(56) References Cited

U.S. PATENT DOCUMENTS

| | | |
|---|---|---|
| 2016/0005824 A1 | 1/2016 | Lin et al. |
| 2019/0131478 A1 | 5/2019 | Wang et al. |
| 2020/0135617 A1* | 4/2020 | Shen .................. H01L 23/5226 |

OTHER PUBLICATIONS

Foggiato et al. "Optimizing the Formation of Nickel Silicide." Materials Science and Engineering B 114-115 (2004) 56-60.
Xiang, Ruifei. "Formation of Heat Resistant Ni Silicide Using Metal Additive for Nanoscale CMOS." Iwai Laboratory, Department of Advanced Applied Electronics, Tokyo Institute of Technology. Published Jan. 14, 2006.
U.S. Appl. No. 16/391,550, filed Apr. 23, 2019.

* cited by examiner

CONDUCTIVE CONTACT FOR ION THROUGH-SUBSTRATE VIA

REFERENCE TO RELATED APPLICATION

This Application claims the benefit of U.S. Provisional Application No. 62/893,333, filed on Aug. 29, 2019, the contents of which are hereby incorporated by reference in their entirety.

BACKGROUND

The semiconductor industry has continually improved the processing capabilities and power consumption of integrated circuits (ICs) by shrinking the minimum feature size. However, in recent years, process limitations have made it difficult to continue shrinking the minimum feature size. The stacking of two-dimensional (2D) ICs into three-dimensional (3D) ICs has emerged as a potential approach to continue improving processing capabilities and power consumption of ICs. Commonly, through-substrate vias (TSVs) are used to electrically couple stacked 2D ICs together.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
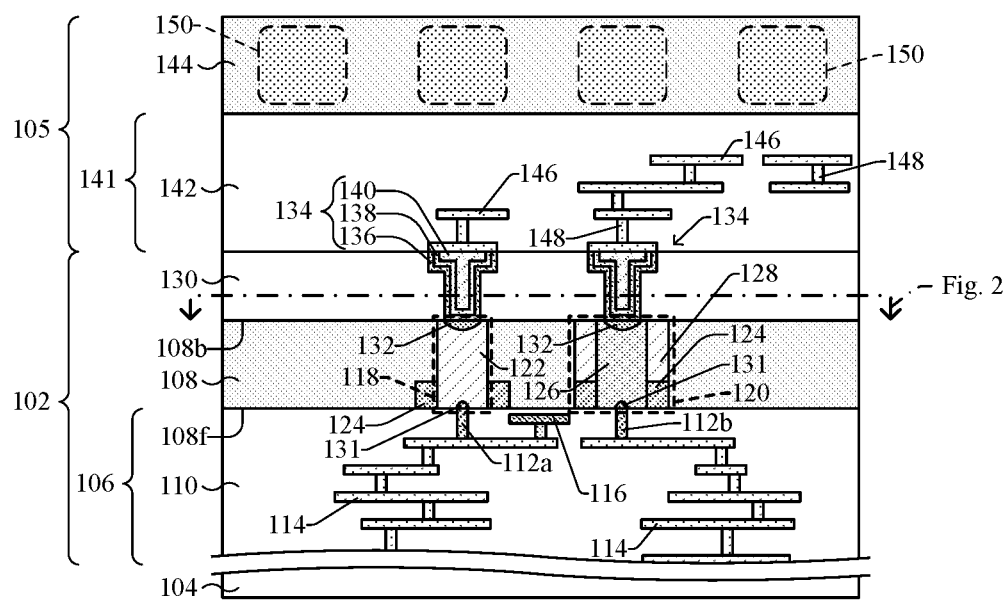
FIG. 1 illustrates a cross-sectional view of some embodiments of a three-dimensional (3D) integrated circuit (IC) including a first IC die having ion through-substrate vias (TSVs) and a second IC die having semiconductor devices, where conductive contacts overlie the ion TSVs and upper conductive layers are disposed between the conductive contacts and the ion TSVs.

The present disclosure provides many different embodiments, or examples, for implementing different features of this disclosure. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

One type of three-dimensional (3D) integrated circuit (IC) comprises a first IC die and a second IC die under the first IC die. The first and second IC dies are two-dimensional (2D) IC dies, and comprise respective semiconductor substrates and respective interconnect structures. The interconnect structures are between the semiconductor substrates. The interconnect structures comprise alternating stacks of wiring layers (e.g., horizontal routing) and via layers (e.g., vertical routing). The interconnect structures contact at a bonding interface between the first and second IC dies.

The 3D IC further comprises a plurality of ion through-substrate vias (TSVs) extending through the semiconductor substrate of the first IC die, from a back-side of the semiconductor substrate of the first IC die to a front-side of the semiconductor substrate of the first IC die. The interconnect structure of the first IC is disposed on the front-side of the semiconductor substrate of the first IC die, and one or more conductive contacts is/are disposed directly over the 3D IC on the back-side of the semiconductor substrate of the first IC die. The conductive contacts electrically couple correspondingly with the ion TSVs, and the ion TSVs are electrically coupled to wiring layers in the interconnect structure of the first IC die. A challenge with the above structure is that the conductive contacts comprise a conductive material (e.g., titanium, titanium nitride, or the like) that does not form a good electrical contact (e.g., an ohmic contact) with a corresponding ion TSV. This may be because the conductive material may have a high resistivity, and thus is unable to form the good electrical connection with a p-type and/or an n-type ion TSV. The lack of a good electrical connection between the conductive contact and the ion TSV may reduce a performance of semiconductor devices within the 3D IC.

It has been appreciated that in order to achieve a good electrical connection between the ion TSV and the conductive contact, the conductive contact may be comprised of a low resistivity silicide of the conductive material. For example, the low resistivity silicide may be or comprise titanium silicide (e.g., $TiSi_2$). However, in order to form the low resistivity conductive material, high annealing temperatures (e.g., greater than 600 degrees Celsius) may be utilized during formation of the conductive contact. The 3D IC is exposed to the high temperatures after forming the first and second interconnect structures and after bonding the first IC die to the second IC die. The high annealing temperatures may cause damage to devices (e.g., transistors, photodetectors, metal-insulator-metal (MIM) capacitors, and/or other semiconductor devices) and/or layers disposed within the first IC die and/or the second IC die, thereby reducing a performance of the 3D IC and/or rendering the 3D IC inoperable.

Various embodiments of the present application are directed towards a 3D IC including a conductive contact that has a good electrical connection (e.g., an ohmic contact) with an ion TSV and/or a method for forming the conductive contact. In some embodiments, an ion TSV is formed by forming a masking layer over a semiconductor substrate and implanting dopants (e.g., n-type and/or p-type) into the semiconductor substrate. The ion TSV extends and provides electrical coupling from a front-side surface of the semiconductor substrate to an opposing back-side surface of the semiconductor substrate. A conductive contact is formed over the back-side surface of the semiconductor substrate and overlies the ion TSV. The conductive contact may be formed by depositing one or more conductive layers over the ion TSV, such that a first conductive layer overlying and/or contacting the ion TSV may, for example, comprise nickel. Subsequently, one or more photodetectors are formed within the semiconductor substrate and/or within an upper semiconductor substrate overlying the ion TSV. After forming the one or more photodetectors, an annealing process is performed on the 3D IC to remove defects in the semiconductor substrate and/or the upper semiconductor substrate. The annealing process my reach a low maximum temperature (e.g., up to about 410 degrees Celsius) and may be configured to reduce while pixels and/or dark current within the 3D IC. Further, the annealing process concurrently converts at least a portion of the semiconductor substrate underlying the first conductive layer into an upper conductive layer comprising a low resistivity conductive material (e.g., comprising a silicide such as nickel silicide (NiSi)). This in turn results in a good electrical connection (e.g., an ohmic contact) between the conductive contact and the ion TSV. Further, because the annealing process may reach the low maximum annealing temperature (e.g., about 410 degrees Celsius), damage to semiconductor devices and/or layers disposed on/within the semiconductor substrate may be mitigated and/or reduced. Therefore, the low resistivity conductive material being formed at the low maximum annealing temperature mitigates damage to devices and/or layers disposed within the 3D IC while achieving a good electrical contact (e.g., an ohmic contact) between the conductive contact and the ion TSV.

FIG. 1 illustrates a cross-sectional view of some embodiments of a three-dimensional (3D) integrated circuit (IC) 100 having a first IC die 102, a second IC die 104, and a pixel IC die 105 overlying the first IC die 102.

The first IC die 102 overlies the second IC die 104 and includes a first semiconductor substrate 108 and a first interconnect structure 106 extending along a front-side 108f of the first semiconductor substrate 108. The first interconnect structure 106 is disposed between the first semiconductor substrate 108 and the second IC die 104. One or more semiconductor devices (not shown) may be disposed within the second IC die 104, such that the first interconnect structure 106 is electrically coupled to the one or more semiconductor devices. In some embodiments, the first interconnect structure 106 includes a first interconnect dielectric structure 110, a plurality of conductive wires 114, a plurality of conductive vias 112, and a channel control contact 116. In some embodiments, the channel control contact 116 is configured to provide control of a conductive channel within a complementary metal-oxide-semiconductor (CMOS) device (such as a transistor (not shown)). In some embodiments, the first semiconductor substrate 108 may, for example, be or comprise a semiconductor substrate material, such as silicon. Further, the conductive vias 112 may include a first conductive via 112a and a second conductive via 112b.

In some embodiments, the first semiconductor substrate 108 overlies the first interconnect structure 106 and may comprise a first doping type (e.g., p-type). A first through-substrate via (TSV) 118 and a second TSV 120 respectively extend continuously from a back-side 108b of the first semiconductor substrate 108 to the front-side 108f of the first semiconductor substrate 108. The first and second TSVs 118, 120 are electrically coupled to the one or more semiconductor devices (not shown) disposed within the second IC die 104 by way of the first interconnect structure 106. In some embodiments, the first TSV 118 comprises a first doped channel region 122 surrounded by an isolation structure 124. In further embodiments, outer sidewalls of the first doped channel region 122 adjoin inner sidewalls of the isolation structure 124. In yet further embodiments, the first doped channel region 122 is a doped region of the first semiconductor substrate 108 comprising a second doping type (e.g., n-type) opposite the first doping type (e.g., p-type). In some embodiments, the first doping type is p-type and the second doping type is n-type, or vice versa. Thus, in some embodiments, the first TSV 118 may, for example, comprise the semiconductor substrate material (e.g., silicon). Further, the first conductive via 112a may directly underlie the first TSV 118.

In further embodiments, the second TSV 120 comprises a second doped channel region 126 surrounded by a third doped channel region 128. In some embodiments, an isolation structure 124 surrounds the second doped channel region 126, such that outer sidewalls of the second doped channel region 126 adjoin inner sidewalls of the isolation structure 124. In further embodiments, the second doped channel region 126 comprises the first doping type (e.g., p-type) and the third doped channel region 128 comprises the second doping type (e.g., n-type). In yet further embodiments, the second and third doped channel regions 126, 128 are respectively doped regions of the first semiconductor substrate 108. Thus, in some embodiments, the second TSV 120 may, for example, comprise the semiconductor substrate material (e.g., silicon). Further, the second conductive via 112b may directly underlie the second TSV 120.

An upper dielectric structure 130 overlies and extends along the back-side 108b of the first semiconductor substrate 108. In some embodiments, one or more conductive contacts 134 extend through the upper dielectric structure 130 and overlie the first TSV 118 and the second TSV 120. In some embodiments, the conductive contacts 134 respectively comprise a first conductive layer 136, a second conductive layer 138, and a third conductive layer 140. In yet further embodiments, an upper conductive layer 132 is disposed within the first semiconductor substrate 108 and underlies the conductive contacts 134. In some embodiments, an upper surface of the upper conductive layer 132 is aligned with the back-side 108b of the first semiconductor substrate 108. In further embodiments, the upper conductive layer 132 directly contacts the first conductive layer 136. In yet further embodiments, lower conductive layers 131 are disposed within the first semiconductor substrate 108 and overlie a corresponding one of the first and second TSVs 118, 120.

In some embodiments, the pixel IC die 105 overlies the first IC die 102 and includes an upper interconnect structure 141 and a pixel substrate 144. The upper interconnect structure 141 is disposed between the upper dielectric structure 130 and the pixel substrate 144. In some embodiments, the upper interconnect structure 141 comprises an upper interconnect dielectric structure 142, a plurality of conductive wires 146, and a plurality of conductive vias 148. In some embodiments, the pixel substrate 144 may, for example, be or comprise the semiconductor substrate material (e.g., silicon) and/or may comprise the first doping type (e.g., p-type). A plurality of photodetectors 150 are disposed within the pixel substrate 144. In some embodiments, the plurality of photodetectors 150 may respectively comprise the second doping type (e.g., n-type) and may be configured to convert incident radiation (e.g., light) into an electrical signal. In further embodiments, one or more pixel devices (not shown) may be disposed on and/or within the pixel substrate 144 and may be configured to conduct readout of the electrical signal. The one or more pixel devices may be electrically coupled to the first and second TSVs 118, 120 by way of the upper interconnect structure 141. In further embodiments, the one or more pixel devices may, for example, be or include transfer transistor(s), source follower transistor(s), row select transistor(s), reset transistor(s), another suitable pixel device, or a combination of the foregoing.

During fabrication of the 3D IC 100, an annealing process is performed after forming the photodetectors 150 to reduce white pixel and/or dark current within the 3D IC 100. The annealing process is configured to remove impurities from the pixel substrate 144 and reaches a maximum temperature (e.g., about 410 degrees Celsius). Before forming the photodetectors 150, the first conductive layer 136 is formed over a corresponding TSV 118, 120. The first conductive layer 136 may, for example, be or comprise a conductive material (e.g., nickel (Ni)). The conductive material is configured to be converted to a silicide material during the annealing process. Thus, during the annealing process, the upper conductive layer 132 may be formed within the first semiconductor substrate 108. In some embodiments, the upper conductive layer 132 may be or comprise a silicide (e.g., nickel silicide (NiSi)) of the conductive material. The upper conductive layer 132 is configured to facilitate a good electrical connection (e.g., an ohmic contact) between the conductive contacts 134 and a corresponding TSV 118, 120. Further, because the maximum temperature (e.g., about 410 degrees Celsius) is less than a high annealing temperature (e.g., about 600 degrees Celsius), damage to semiconductor devices and/or layers disposed within the 3D IC 100 may be mitigated and/or eliminated. Therefore, the upper conductive layer 132 may be formed without performing additional processing sets and may facilitate a good electrical connection (e.g., an ohmic contact) between the conductive contacts 134 and a corresponding TSV 118, 120. This in turn reduces time and costs associated with fabricating the 3D IC 100 while increasing a performance of semiconductor devices disposed within the 3D IC 100.

In yet further embodiments, the first and second conductive vias 112a, 112b may each be or comprise the conductive material. Thus, in some embodiments, the annealing process may form the lower conductive layer 131 within the first semiconductor substrate 108. The lower conductive layer 131 may, for example, be or comprise the silicide (e.g., NiSi) of the conductive material. This in turn facilitates a good electrical connection (e.g., an ohmic contact) between the first and second conductive vias 112a, 112b and the corresponding first or second TSV 118, 120. In yet further embodiments, the lower conductive layer 131 may be formed concurrently with the upper conductive layer 132 during the annealing process.

Figure 2:
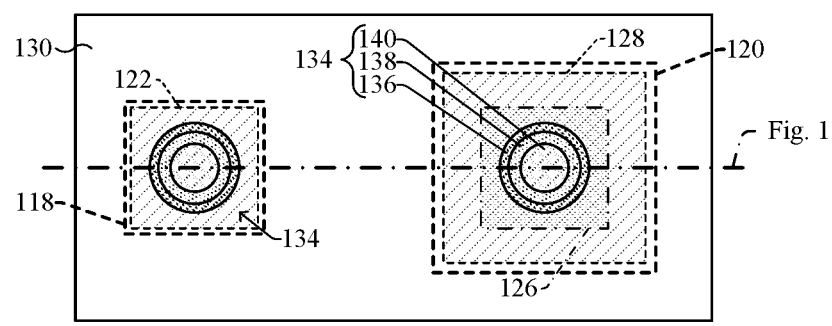
FIG. 2 illustrates a top view of some embodiments of the 3D IC of FIG. 1 according to the line in FIG. 1.

FIG. 2 illustrates a top view 200 of some alternative embodiments of the 3D IC 100 of FIG. 1 according to the line in FIG. 1.

As illustrated in the top view 200 of FIG. 2, the first and second TSVs 118, 120 may respectively have a rectangular shape, a square shape, or another suitable shape when viewed from above. For example, the first doped channel region 122, the second doped channel region 126, and the third doped channel region 128 may respectively have the rectangular shape, the square shape, or another suitable shape when viewed from above. Further, the conductive contacts 134 may respectively have a circular shape, an ellipse shape, or another suitable shape when viewed from above. In some embodiments, the first conductive layer 136 laterally encloses the second conductive layer 138 and the second conductive layer 138 laterally surrounds the third conductive layer 140.

Figure 3A:
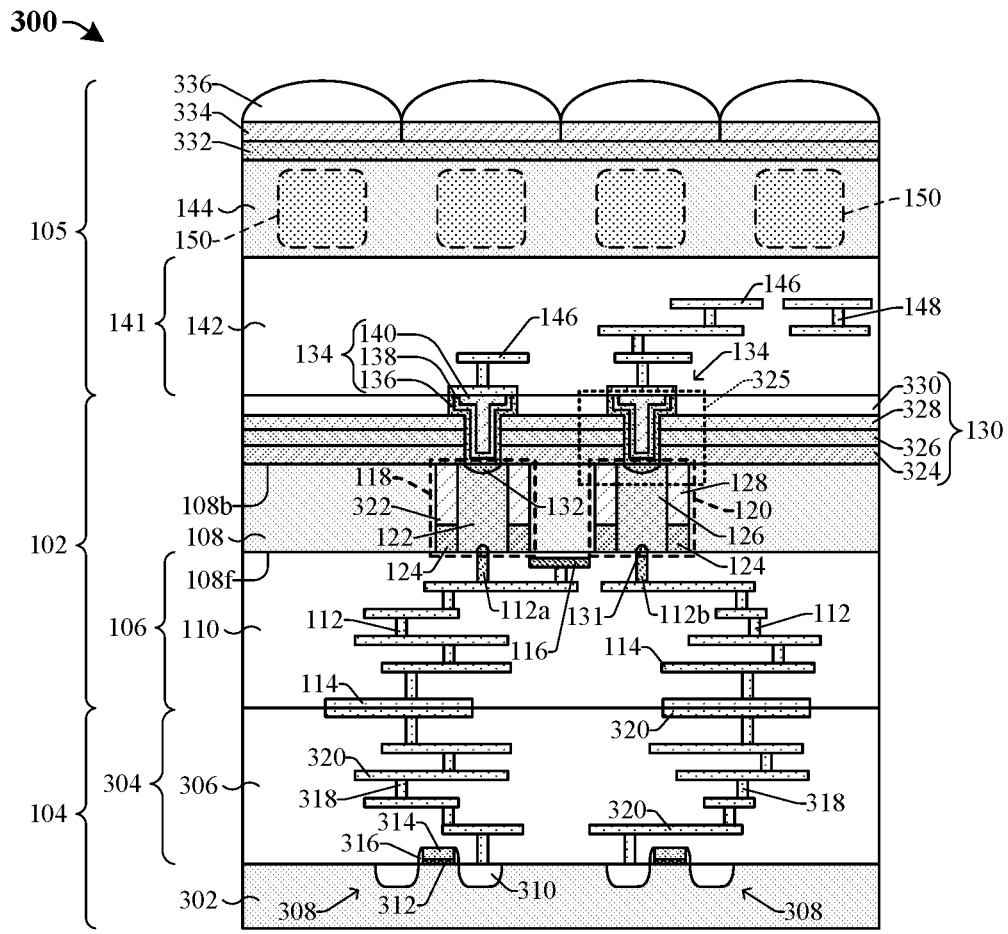
FIG. 3A illustrates a cross-sectional view of some alternative embodiments of a 3D IC including a first IC die, a second IC die, and a pixel die, in which the first IC die includes one or more ion TSVs and the pixel die includes a plurality of photodetectors.

FIG. 3A illustrates a cross-sectional view of some embodiments of a 3D IC 300 according to some alternative embodiments of the 3D IC 100 of FIG. 1.

The 3D IC 300 includes a first IC die 102, a second IC die 104, and a pixel IC die 105. The first IC die 102 is disposed between the second IC die 104 and the pixel IC die 105. In some embodiments, the second IC die 104 includes a second interconnect structure 304 and a second semiconductor substrate 302. In some embodiments, the second semiconductor substrate 302 may, for example, be or comprise a semiconductor substrate material (e.g., silicon), a bulk substrate (e.g., a bulk silicon substrate), a silicon-on-insulator (SOI) substrate, or some other suitable substrate and/or may comprise a first doping type (e.g., p-type). The second interconnect structure 304 overlies the second semiconductor substrate 302. In further embodiments, the second interconnect structure 304 includes a second interconnect dielectric structure 306, a plurality of conductive vias 318, and a plurality of conductive wires 320. The second interconnect structure 304 may, for example, be or comprise one or more inter-level dielectric (ILD) layers. The one or more ILD layers may, for example, respectively be or comprise an oxide, such as silicon dioxide, a low-k dielectric material, an extreme low-k dielectric material, or another suitable dielectric material. In some embodiments, the plurality of conductive vias and/or wires may, for example, be or comprise aluminum, copper, titanium, tantalum, tungsten, a combination of the foregoing, or another suitable conductive material.

In some embodiments, a plurality of semiconductor devices 308 are disposed over and/or within the second semiconductor substrate 302. In some embodiments, the semiconductor devices 308 may, for example, be metal-oxide-semiconductor field-effect transistors (MOSFETs), some other metal-oxide-semiconductor (MOS) devices, some other insulated-gate field-effect transistors (IGFETs), some other semiconductor devices, or any combination of the foregoing. In further embodiments, the semiconductor devices 308 may respectively include source/drain regions 310, a gate dielectric layer 312, a gate electrode 314, and a sidewall spacer structure 316. In yet further embodiments, the source/drain regions 310 may each comprise a second doping type (e.g., n-type) opposite the first doping type. In some embodiments, the first doping type is p-type and the second doping type is n-type, or vice versa.

The first IC die 102 overlies the second IC die 104. The first IC die 102 includes a first interconnect structure 106, a first semiconductor substrate 108, and an upper dielectric structure 130. In some embodiments, the first semiconductor substrate 108 may, for example, be or comprise the semiconductor substrate material (e.g., silicon), a bulk substrate (e.g., a bulk silicon substrate), a silicon-on-insulator (SOI) substrate, or some other suitable substrate and/or may comprise the first doping type (e.g., p-type). In further embodiments, the first interconnect structure 106 underlies the first semiconductor substrate 108 and includes a first interconnect dielectric structure 110, a plurality of conductive vias 112, a plurality of conductive wires 114, and a channel control contact 116. In some embodiments, the channel control contact 116 may, for example, be or comprise polysilicon, doped polysilicon, a metal, a combination of the foregoing, or another suitable conductive material. In further embodiments, semiconductor devices, such as transistors (not shown) may be disposed on the first semiconductor substrate 108. In various embodiments, the channel control contact 116 may be configured to apply a bias voltage to a gate electrode of one of the transistors to control a selectively conductive channel within the first semiconductor substrate 108.

In some embodiments, the first interconnect dielectric structure 110 includes a plurality of ILD layers that may, for example, respectively be or comprise silicon dioxide, a low-k dielectric material, an extreme low-k dielectric material, a combination of the foregoing, or another suitable dielectric material. In further embodiments, the conductive vias and/or wires 112, 114 may, for example, be or comprise aluminum, copper, titanium, tantalum, a combination of the foregoing, or another suitable conductive material. In some embodiments, the first interconnect structure 106 and the second interconnect structure 304 are bonded to one another by, for example, a hybrid bond, a fusion bond, and/or a metallic bond. In further embodiments, the conductive vias 112 may comprise a first conductive via 112a and a second conductive via 112b. In some embodiments, the first and second conductive vias 112a, 112b may respectively be or comprise nickel (Ni).

Further, a first TSV 118 and a second TSV 120 respectively extend from a front-side 108f of the first semiconductor substrate 108 to a back-side 108b of the first semiconductor substrate 108. In some embodiments, isolation structures 124 extend from the front-side 108f to a point above the front-side 108f. In some embodiments, the isolation structures 124 may, for example, respectively be configured as shallow trench isolation (STI) structure(s), deep trench isolation (DTI) structure(s), or another suitable isolation structure. In further embodiments, the isolation structures 124 may, for example, be or comprise a dielectric material, such as silicon dioxide, silicon nitride, silicon carbide, silicon oxynitride, a combination of the foregoing, or another suitable dielectric material. In some embodiments, the first TSV 118 may include a first doped channel region 122 and a fourth doped channel region 322. In further embodiments, the first doped channel region 122 may comprise the first doping type (e.g., p-type) and the fourth doped channel region 322 may comprise the second doping type (e.g., n-type). In yet further embodiments, the second TSV 120 may include a second doped channel region 126 comprising the first doping type (e.g., p-type) and a third doped channel region 128 comprising the second doping type (e.g., n-type).

In some embodiments, depletion regions form respectively at outer regions of the first and second TSVs 118, 120. The depletion regions may form because of p-n junctions between the fourth doped channel region 322 and the first semiconductor substrate 108 and/or p-n junctions between the third doped channel region 128 and the first semiconductor substrate 108. In further embodiments, a depletion region forms at an interface between the first doped channel region 122 and the fourth doped channel region 322. Further, a depletion region may form at an interface between the second doped channel region 126 and the third doped channel region 128. The first and second TSVs 118, 120 provide electrical coupling between the plurality of semiconductor devices 308 and conductive contacts 134 by way of the first and second interconnect structures 106, 304. This, in part, is because under certain operation conditions, for example, the p-n junctions may act as diodes, such that current flows from a P-type region to an N-type region (but current may not flow from the N-type region to the P-type region.

By virtue of the first and second TSVs 118, 120 comprising doped regions of the first semiconductor substrate 108, the first and second TSVs 118, 120 may be laterally spaced above the semiconductor devices 308 and/or spaced laterally beneath photodetectors 150. The semiconductor substrate material (e.g., silicon) of the first and second TSVs 118, 120 mitigates mechanical stress induced upon the underlying semiconductor devices 308 and/or the overlying photodetectors 150. This in turn may prevent device failure (e.g., due to mechanical stress) of the semiconductor devices 308 and/or the photodetectors 150.

An upper dielectric structure 130 extends along the backside 108b of the first semiconductor substrate 108. In some embodiments, the upper dielectric structure 130 includes a first passivation layer 324, a second passivation layer 326, a third passivation layer 328, and an upper dielectric layer 330. In some embodiments, the first passivation layer 324 may, for example, be or comprise an oxide, such as silicon dioxide, or another suitable dielectric material. In some embodiments, the second passivation layer 326 may, for example, be or comprise a nitride, such as silicon nitride, or another suitable dielectric material. In further embodiments, the third passivation layer 328 may, for example, be or comprise an oxide, such as silicon dioxide, or another suitable dielectric material. The upper dielectric layer 330 may, for example, be or comprise silicon dioxide, a low-k dielectric material, or another suitable dielectric material. Conductive contacts 134 respectively extend from the pixel IC die 105, through the upper dielectric structure 130, to the first semiconductor substrate 108. In some embodiments, the conductive contacts 134 are configured to electrically couple the first and second TSVs 118, 120 to the pixel IC die 105.

The pixel IC die 105 overlies the first IC die 102 and includes a pixel substrate 144 and an upper interconnect structure 141. In some embodiments, the pixel substrate 144 may, for example, be or comprise the semiconductor substrate material (e.g., silicon), a bulk semiconductor substrate (e.g., a bulk silicon substrate), an SOI substrate, or another suitable substrate and/or may comprise the first doping type (e.g., p-type). The upper interconnect structure 141 may include an upper interconnect dielectric structure 142, a plurality of conductive wires 146, and a plurality of conductive vias 148. In some embodiments, the upper interconnect structure 141 may comprise one or more ILD layers. In further embodiments, the conductive vias and wires 148, 146 may, for example, respectively be or comprise aluminum, copper, titanium, tantalum, or another suitable conductive material. The plurality of photodetectors 150 are disposed within the pixel substrate 144. In some embodiments, the photodetectors 150 may, for example, comprise the second doping type (e.g., n-type) and may be configured to convert electromagnetic radiation (e.g., photons) to electric signals (i.e., to generate electron-hole pairs from the electromagnetic radiation).

The conductive contacts 134 are configured to electrically couple the first and second TSVs 118, 120 to the upper interconnect structure 141. In some embodiments, the conductive contacts 134 directly overlie a corresponding one of the first and second TSVs 118, 120. In yet further embodiments, the conductive contacts 134 may respectively include a first conductive layer 136, a second conductive layer 138, and a third conductive layer 140. In some embodiments, the first, second, and third conductive layers 136, 138, 140 respectively comprise a different material from one another. In various embodiments, the first conductive layer 136 may be or comprise nickel (Ni), the second conductive layer 138 may be or comprise titanium nitride (TiN), and the third conductive layer 140 may be or comprise tungsten (W). In further embodiments, the second conductive layer 138 may, for example, be or comprise titanium, tantalum, titanium nitride, tantalum nitride, a combination of the foregoing, or the like.

An upper conductive layer 132 may underlie each of the conductive contacts 134. In some embodiments, the upper conductive layer 132 directly contacts the first and/or second TSVs 118, 120. The upper conductive layer 132 is configured to facilitate a good electrical connection (e.g., an ohmic contact) between the first and/or second TSV 118, 120 and a corresponding conductive contact 134. In some embodiments, the first conductive layer 136 comprises a conductive material (e.g., nickel) and the upper conductive layer 132 comprises a silicide of the conductive material. For example, the upper conductive layer 132 may be or comprise nickel silicide (NiSi). In some embodiments, a resistivity of the upper conductive layer 132 is within a range of about 10 to 20 micro-Ohms centimeter ($\mu\Omega$-cm), within a range of about 10.5 to 15 $\mu\Omega$-cm, within a range of about 5 to 25 $\mu\Omega$-cm, less than about 25 $\mu\Omega$-cm, or another suitable value. In some embodiments, if the resistivity of the upper conductive layer 132 is greater than about 25 $\mu\Omega$-cm, then the conductive contacts 134 may not form a good electrical connection with a corresponding one of the first and/or second TSVs 118, 120. Thus, in some embodiments, by virtue of the resistivity of the upper conductive layer 132 being less than about 25 $\mu\Omega$-cm, a contact resistance between the conductive contacts 134 and a corresponding one of the first and/or second TSVs 118, 120 is reduced, thereby increasing a performance of devices disposed within/on the 3D IC 300. In further embodiments, the lower conductive layer 131 is configured as the upper conductive layer 132, such that the lower conductive layer 131 may, for example, be or comprises nickel silicide (NiSi). In yet further embodiments, a resistivity of the lower conductive layer 131 is within a range of about 10 to 20 micro-Ohms centimeter $\mu\Omega$-cm, within a range of about 10.5 to 15 $\mu\Omega$-cm, within a range of about 5 to 25 $\mu\Omega$-cm, less than about 25 $\mu\Omega$-cm, or another suitable value. This in turn facilitates a good electrical connection (e.g., an ohmic contact) between the first and/or second conductive vias 112a, 112b and a corresponding one of the first and/or second TSVs 118, 120.

Further, in some embodiments, the upper conductive layer 132 is configured to have a Schottky barrier height with a doped region of the first semiconductor substrate 108 that promotes efficient carrier transport, for example, promoting carrier (e.g., electron) transport between the conductive contacts 134 and a corresponding one of the first and/or second TSVs 118, 120. In further embodiments, if the conductive contacts 134 contact the upper conductive layer 132 that directly overlies a doped region of the first semiconductor substrate 108 comprising the second doping type (e.g., n-type), then a Schottky barrier height between the upper conductive layer 132 and the doped region of the first semiconductor substrate 108 may be about 0.60 electron volt (eV), 0.65 eV, within a range of about 0.55 to 0.70 eV, or another suitable value. This in turn facilitates the good electrical connection (e.g., an ohmic contact) between the conductive contacts 134 and a corresponding one of the first and/or second TSVs 118, 120.

In some embodiments, the first semiconductor substrate 108 comprises the semiconductor substrate material (e.g., silicon) with a (100) orientation. In further embodiments, a contact resistivity between the lower and/or upper conductive layers 131, 132 and a corresponding first doped region of the first semiconductor substrate 108 may be within a range of about $5*10^{-8}$ to $5*10^{-7}$ $\Omega cm^2$, within a range of about $5*10^{-8}$ to $10*10^{-8}$ $\Omega cm^2$, within a range of about $1*10^{-7}$ to $5*10^{-7}$ $\Omega cm^2$, less than $10*10^{-7}$ $\Omega cm^2$, or another suitable value. In yet further embodiments, the lower and/or upper conductive layer 131, 132 may be or comprise nickel silicide (NiSi) formed at a maximum temperature of about 350 degree Celsius and/or the first doped region of the first semiconductor substrate 108 may for example be or comprise the first doping type (e.g., p-type) with a doping concentration within a range of about $1*10^{16}$ to $1*10^{20}$ atoms/cm$^3$. In some embodiments, a contact resistivity between the lower and/or upper conductive layers 131, 132 and a corresponding second doped region of the first semiconductor substrate 108 may be within a range of about $1*10^{-8}$ to $1*10^{-7}$ $\Omega cm^2$, within a range of about $1*10^{-8}$ to $5*10^{-8}$ $\Omega cm^2$, within a range of about $5*10^{-8}$ to $10*10^{-8}$ $\Omega cm^2$, less than $1*10^{-7}$ $\Omega cm^2$, or another suitable value. In some embodiments, the lower and/or upper conductive layer 131, 132 may be or comprise nickel silicide (NiSi) formed at a maximum temperature of about 350 degree Celsius and/or the second doped region of the first semiconductor substrate 108 may for example be or comprise the second doping type (e.g., n-type) with a doping concentration within a range of about $1*10^{16}$ to $1*10^{20}$ atoms/cm$^3$.

In some embodiments, an anti-reflection layer 332 directly overlies an upper surface of the pixel substrate 144. The anti-reflection layer 332 is configured to mitigate reflection of electromagnetic radiation off of the pixel substrate 144. A plurality of color filters 334 (e.g., a red color filter, a blue color filter, a green color filter, or another color filter) directly contacts or is otherwise on the anti-reflection layer 332. The color filters 334 are respectively configured to transmit specific wavelengths of electromagnetic radiation. Further, a plurality of micro-lenses 336 are disposed over the color filters 334. The micro-lenses 336 are configured to focus electromagnetic radiation (e.g., photons) towards the photodetectors 150.

Figure 3B:
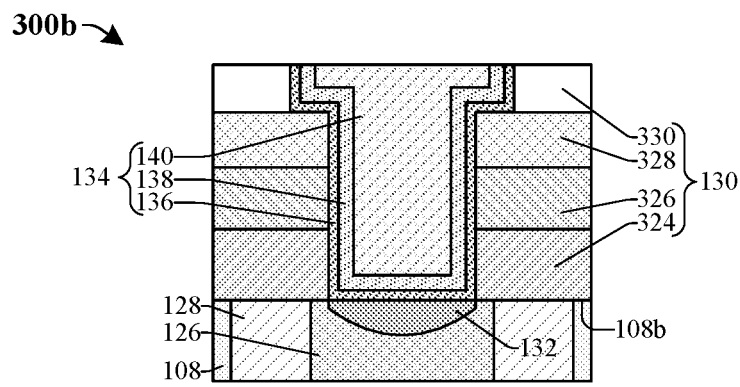
FIGS. 3B and 3C illustrate cross-sectional views of some alternative embodiments of close-up views of a section of the 3D IC of FIG. 3A.

FIG. 3B illustrates a cross-sectional view 300b of some embodiments of a section of the 3D IC 300 of FIG. 3A according to the dashed box 325 in FIG. 3A.

A bottom surface of the conductive contact 134 is aligned with a back-side 108b of the first semiconductor substrate 108. In some embodiments, a top surface of the upper conductive layer 132 is aligned with the back-side 108b of the first semiconductor substrate 108. In some embodiments, the second doped channel region 126 laterally surrounds an outer perimeter of the upper conductive layer 132 and cups an underside of the upper conductive layer 132. Therefore, in some embodiments, the upper conductive layer 132 directly contacts the second doped channel region 126 and directly contacts the conductive contact 134. In yet further embodiments, the upper conductive layer 132 is laterally spaced between sidewalls of the second doped channel region 126. In some embodiments, a thickness of the first conductive layer 136 is less than a thickness of the second conductive layer 138 and the thickness of the second conductive layer 138 is less than a thickness of the third conductive layer 140.

Figure 3C:
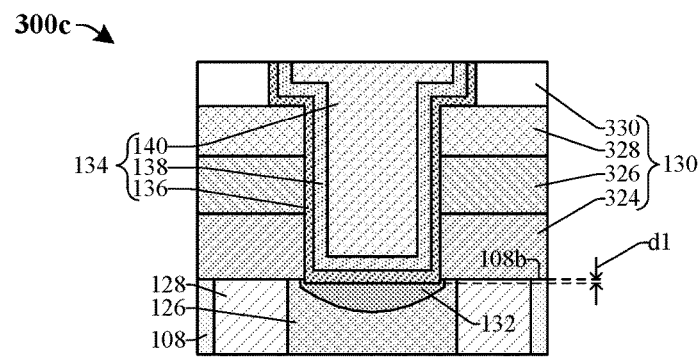

FIG. 3C illustrates a cross-sectional view 300c of some alternative embodiments of a section of the 3D IC 300 of FIG. 3A according to the dashed box 325 in FIG. 3A.

In some embodiments, a bottom surface of the conductive contact 134 is vertically offset from the back-side 108b of the first semiconductor substrate 108 by a distance d1. In further embodiments, the distance d1 is non-zero. In yet further embodiments, the upper conductive layer 132 continuously extends from a sidewall of the first conductive layer 136 to a lower surface of the first conductive layer 136. In alternative embodiments, an upper surface of the upper conductive layer 132 is vertically offset from the back-side 108b of the first semiconductor substrate 108 by the distance d1.

Figure 4:
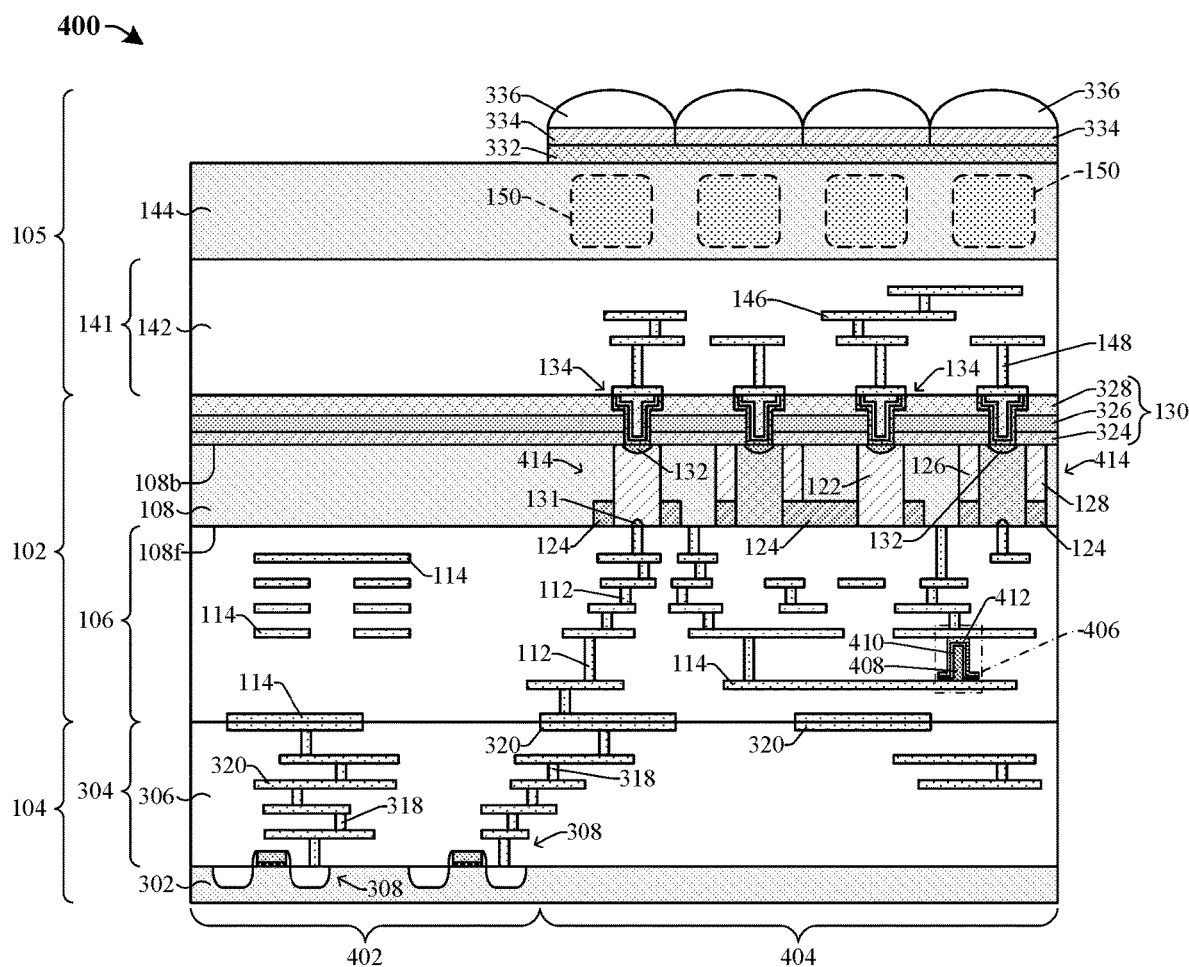
FIG. 4 illustrates a cross-sectional view of some embodiments of a 3D IC having a first IC die, a second IC die, and a pixel die, in which the first IC die includes ion TSVs extending through a first semiconductor substrate and a semiconductor device disposed within a first interconnect structure.

FIG. 4 illustrates a cross-sectional view of some embodiments of a 3D IC 400 including a first IC die 102, a second IC die 104, and a pixel IC die 105 according to some alternative embodiments of the 3D IC 300 of FIG. 3A.

The 3D IC 400 includes a device control region 402 laterally adjacent to a photodetector region 404. In some embodiments, the plurality of semiconductor devices 308 are disposed within the device control region 402 and may be configured to control other semiconductor devices disposed within the 3D IC 400. In some embodiments a metal-insulator-metal (MIM) capacitor 406 is disposed within the first interconnect structure 106. The MIM capacitor 406 may include a first capacitor electrode 408, a capacitor dielectric layer 410, and a second capacitor electrode 412. The capacitor dielectric layer 410 is disposed between the first and second capacitor electrodes 408, 412. In some embodiments, the first capacitor electrode 408 contacts a first conductive wire 114 and the second capacitor electrode 412 contacts a second conductive wire 114.

In some embodiments, a plurality of TSVs 414 are disposed within the first semiconductor substrate 108. In some embodiments, the plurality of TSVs 414, the photodetectors 150 and/or the MIM capacitor 406 are disposed laterally within the photodetector region 404. In further embodiments, the plurality of TSVs 414 may each be configured as the first and/or second TSV 118, 120 of the 3D IC 100 of FIG. 1. A plurality of conductive contacts 134 are disposed within the upper dielectric structure 130 and overlie the TSVs 414. In some embodiments, the first and/or second capacitor electrodes 408, 412 may be electrically coupled to a doped region of the first semiconductor substrate 108. In yet further embodiments, the first and/or second capacitor electrodes 408, 412 may be electrically coupled to one or more of the TSVs 414 by way of the conductive vias and wires 112, 114.

FIGS. 5-17 illustrate cross-sectional views 500-1700 of some embodiments of a method for forming a 3D IC including a first IC die and a second IC die that respectively have ion TSVs and semiconductor devices, where conductive contacts overlie the ion TSVs. Although the cross-sectional views 500-1700 shown in FIGS. 5-17 are described with reference to a method, it will be appreciated that the structures shown in FIGS. 5-17 are not limited to the method but rather may stand alone separate of the method. Although FIGS. 5-17 are described as a series of acts, it will be appreciated that these acts are not limiting in that the order of the acts can be altered in other embodiments, and the methods disclosed are also applicable to other structures. In other embodiments, some acts that are illustrated and/or described may be omitted in whole or in part.

Figure 5:
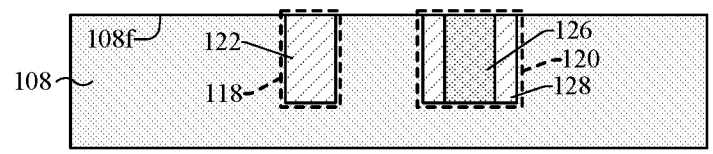
FIGS. 5-17 illustrate a series of cross-sectional views of some embodiments of a method for forming a three-dimensional (3D) integrated circuit (IC) including a first IC die having ion through-substrate vias (TSVs) and a second IC die having semiconductor devices, where conductive contacts overlie the ion TSVs and upper conductive layers are disposed between the conductive contacts and the ion TSVs.

As shown in cross-sectional view 500 of FIG. 5, a first semiconductor substrate 108 is provided. A first TSV 118 and a second TSV 120 are formed within the first semiconductor substrate 108. In some embodiments, the first semiconductor substrate 108 may, for example, be or comprise a bulk substrate (e.g., a bulk silicon substrate), a silicon-on-insulator (SOI) substrate, or some other suitable substrate. In some embodiments, a first implant process may be performed to dope the first semiconductor substrate 108 with a first doping type (e.g., p-type) to a doping concentration of approximately $1*10^{15}$ atoms/cm$^3$. In some embodiments, the p-type dopants of the first doping type may, for example, be or comprise boron, difluoroboron (e.g., $BF_2$), indium, some other suitable p-type dopants, or any combination of the foregoing.

Further, as seen in cross-sectional view 500 of FIG. 5, a second implant process may be performed to selectively form a first doped channel region 122 and a third doped channel region 128 within the first semiconductor substrate 108, where the first doped channel region 122 defines the first TSV 118. In some embodiments, the first doped channel region 122 and the third doped channel region 128 may each have a second doping type (e.g., n-type) opposite the first doping type and may each further have a doping concentration within a range of approximately $1*10^{16}$ to $1*10^{20}$ atoms/cm$^3$. In some embodiments, the second implant process may include: forming a first masking layer (not shown) over a front-side 108f of the first semiconductor substrate 108; selectively implanting the second doping type according to the masking layer, thereby defining the first and third doped channel regions 122, 128; and performing a removal process to remove the masking layer. In some embodiments, the removal process may include an etch process and/or a planarization process (e.g., a chemical mechanical planarization (CMP) process). In some embodiments, the n-type dopants of the second doping type may, for example, be or comprise phosphorous, arsenic, antimony, some other suitable n-type dopants, or any combination of the foregoing.

Furthermore, as seen in cross-sectional view 500 of FIG. 5, a third implant process may be performed to selectively form a second doped channel region 126 within the first semiconductor substrate 108, where the second and third doped channel regions 126, 128 define the second TSV 120. In some embodiments, the second doped channel region 126 comprises the first doping type (e.g., p-type) and has a doping concentration within a range of approximately $1*10^{16}$ to $1*10^{20}$ atoms/cm$^3$. In some embodiments, the doping concentration of the second doped channel region 126 is greater than the doping concentration of the first semiconductor substrate 108. In further embodiments, the second doped channel region 126 may be formed by a counter-doping process. In yet further embodiments, the third implant process may include: forming a second masking layer (not shown) over the front-side 108f of the first semiconductor substrate 108; selectively implanting the first doping type according to the masking layer, thereby defining the second doped channel region 126; and performing a removal process to remove the masking layer. In some embodiments, the removal process may include an etch process and/or a planarization process (e.g., a CMP process).

In further embodiments, after forming the first and second TSVs 118, 120, a rapid thermal annealing (RTA) process is performed on the first semiconductor substrate 108, for example, to repair any damage to the first semiconductor substrate 108 from forming the first and/or second TSVs 118, 120. In yet further embodiments, the RTA process may reach a temperature within a range of approximately 995 to 1010 degrees Celsius.

Figure 6:
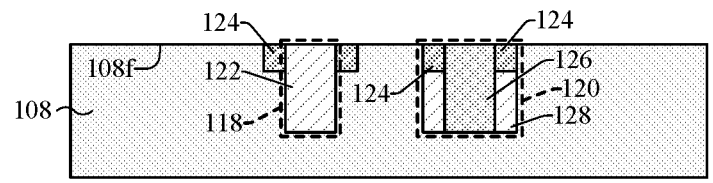

As shown in cross-sectional view 600 of FIG. 6, isolation structures 124 are formed on the front-side 108f of the first semiconductor substrate 108. In some embodiments, formation of the isolation structures 124 may include: forming a masking layer (not shown) over the first semiconductor substrate 108; performing an etch process according to the masking layer to define openings in the first semiconductor substrate 108; filling the openings in the first semiconductor substrate 108 with a dielectric material (e.g., comprising silicon dioxide, silicon nitride, silicon carbide, a combination of the foregoing, or another suitable dielectric material); and performing a removal process to remove the masking layer and/or excess dielectric material (not shown). In yet further embodiments, a plurality of semiconductor devices (e.g., transistors) (not shown) may be formed on the front-side 108f of the first semiconductor substrate 108 before and/or after forming the first and/or second TSVs 118, 120 (not shown).

Figure 7:
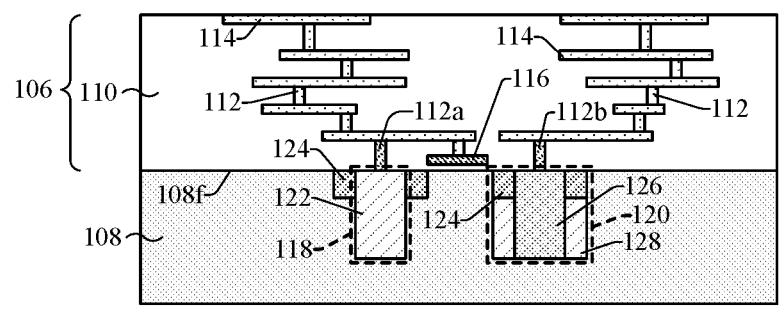

As shown in cross-sectional view 700 of FIG. 7, a first interconnect structure 106 is formed over the front-side 108f of the first semiconductor substrate 108. In some embodiments, the first interconnect structure 106 includes a first interconnect dielectric structure 110, a plurality of conductive wires 114, a plurality of conductive vias 112, and a channel control contact 116. The conductive vias and wires 112, 114 are disposed within the first interconnect dielectric structure 110. Further, the conductive vias 112 may include a first conductive via 112a and a second conductive via 112b. In some embodiments, the first conductive via 112a directly overlies the first TSV 118 and the second conductive via 112b directly overlies the second TSV 120. In further embodiments, the first interconnect dielectric structure 110 may include a plurality of inter-level dielectric (ILD) layers that may, for example, respectively be or comprise an oxide, such as silicon dioxide, or a low-k dielectric material, an extreme low-k dielectric material, a combination of the foregoing, or another suitable dielectric material. In yet further embodiments, a process for forming the first interconnect dielectric structure 110 may include performing one or more chemical vapor deposition (CVD) process(es), physical vapor deposition (PVD) process(es), atomic layer deposition (ALD) process(es), a combination of the foregoing, or another suitable deposition or growth process.

In some embodiments, a process for forming the first interconnect structure 106 may include forming the first and second conductive vias 112a, 112b by a single damascene process and subsequently forming a bottommost layer of the conductive wires 114 by a single damascene process. Further, in some embodiments, the process may further include forming remaining layers of the conductive vias and wires 112, 114 by repeatedly performing a dual damascene process. In some embodiments, the conductive vias and wires 112, 114 may, for example, respectively be or comprise aluminum, copper, titanium, tantalum, a combination of the foregoing, or another suitable conductive material. In yet further embodiments, the first and/or second conductive vias 112a, 112b may, for example, respectively be or comprise nickel, copper, a combination of the foregoing, or another suitable conductive material.

Figure 8:
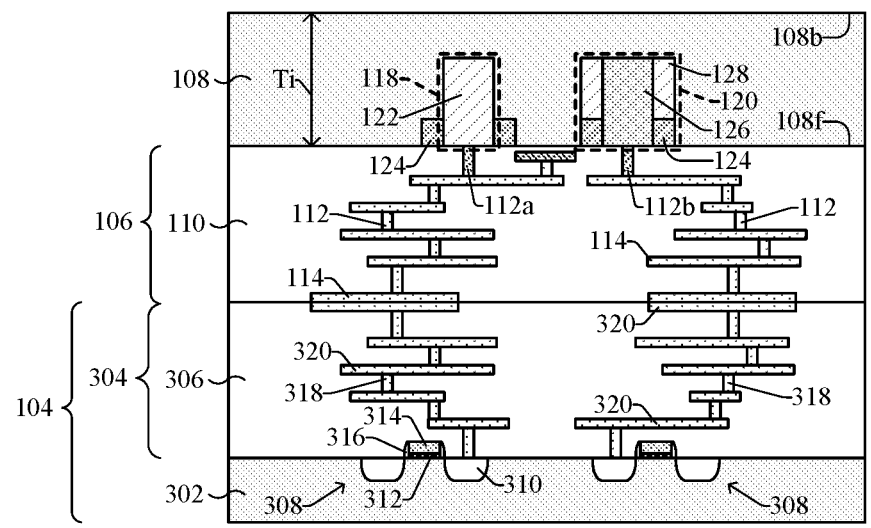

As shown in cross-sectional view 800 of FIG. 8, a second IC die 104 is provided and the structure of FIG. 7 is flipped and subsequently bonded to the second IC die 104. The first interconnect structure 106 interfaces with a second interconnect structure 304 of the second IC die 104 at a hybrid bond. In some embodiments, the second IC die 104 is configured as the second IC die 104 of FIG. 3A or FIG. 4. Further, the hybrid bond comprises a conductor-to-conductor bond between the conductive wires 114 and conductive wires 320. Furthermore, the hybrid bond comprises a dielectric-to-dielectric bond between the first and second interconnect dielectric structures 110, 306. In some embodiments, the process of bonding the first and second interconnect structures 106, 304 may comprise, for example, fusion bonding processes and/or metallic bonding processes. In some embodiments, the first semiconductor substrate 108 has an initial thickness Ti defined between the front-side 108f of the first semiconductor substrate 108 to a back-side 108b of the first semiconductor substrate 108. In some embodiments, the initial thickness Ti is within a range of approximately 750 to 800 micrometers.

Figure 9:
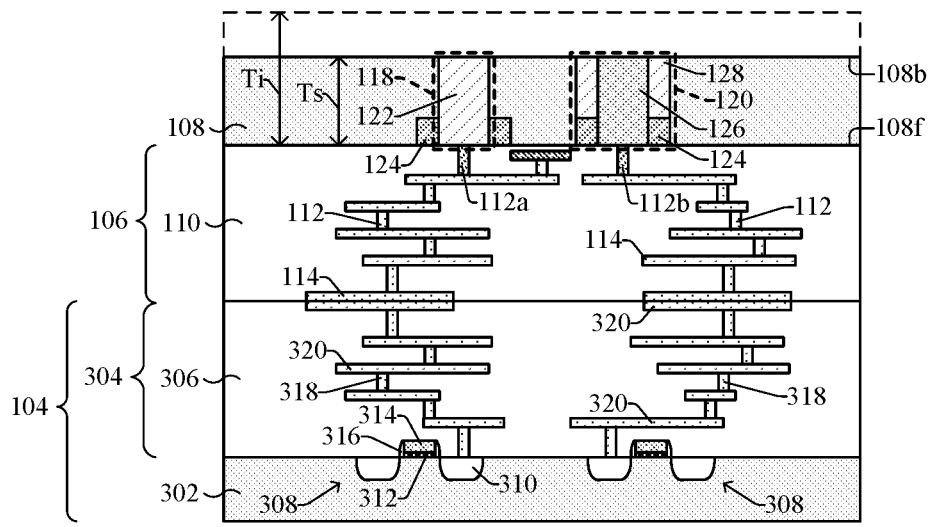

As shown in cross-sectional view 900 of FIG. 9, a thinning process is performed on the back-side 108b of the first semiconductor substrate 108 to expose an upper surface of the first TSV 118 and an upper surface of the second TSV 120. In some embodiments, the thinning process reduces the initial thickness Ti of the first semiconductor substrate 108 to a thickness Ts. In further embodiments, the thickness Ts may be within a range of approximately 1 to 5 micrometers. In yet further embodiments, the thinning process may include a grinding process, an etching process, a mechanical grinding process, a planarization process (e.g., a CMP process), or a combination of the foregoing.

Figure 10:
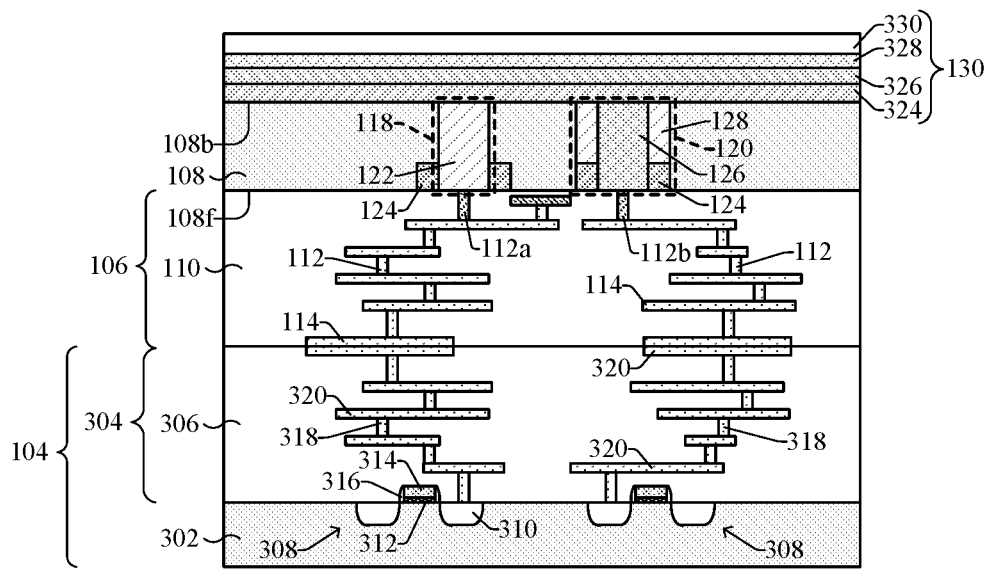

As shown in cross-sectional view 1000 of FIG. 10, an upper dielectric structure 130 is formed over the back-side 108b of the first semiconductor substrate 108. In some embodiments, the upper dielectric structure 130 includes a first passivation layer 324, a second passivation layer 326, a third passivation layer 328, and an upper dielectric layer 330. In some embodiments, the first passivation layer 324 may, for example, be or comprise an oxide, such as silicon dioxide, or another suitable dielectric material. In some embodiments, the second passivation layer 326 may, for example, be or comprise a nitride, such as silicon nitride, or another suitable dielectric material. In further embodiments, the third passivation layer 328 may, for example, be or comprise an oxide, such as silicon dioxide, or another suitable dielectric material. The upper dielectric layer 330 may, for example, be or comprise silicon dioxide, a low-k dielectric material, or another suitable dielectric material. In further embodiments, layers of the upper dielectric structure 130 may, for example, respectively be formed by one or more of a CVD process, a PVD process, or another suitable deposition process.

Figure 11:
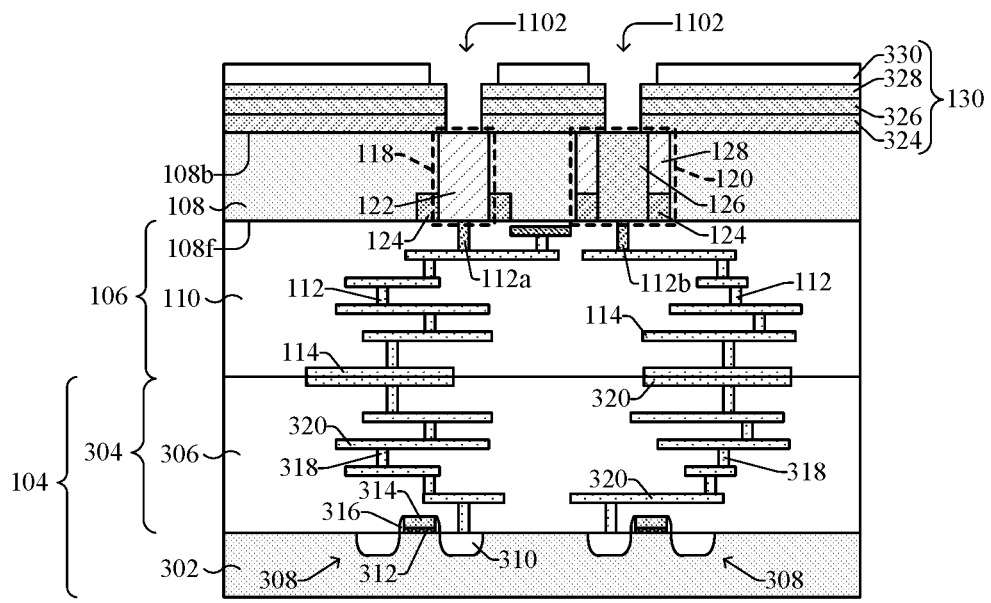

As shown in cross-sectional view 1100 of FIG. 11, the upper dielectric structure 130 is patterned to define contact openings 1102 and expose upper surfaces of the first and second TSVs 118, 120. In some embodiments, the patterning process includes: forming a masking layer (not shown) over the upper dielectric structure 130; exposing unmasked regions of the upper dielectric structure 130 to one or more etchants, thereby defining the contact openings 1102; and performing a removal process to remove the masking layer.

Figure 12:
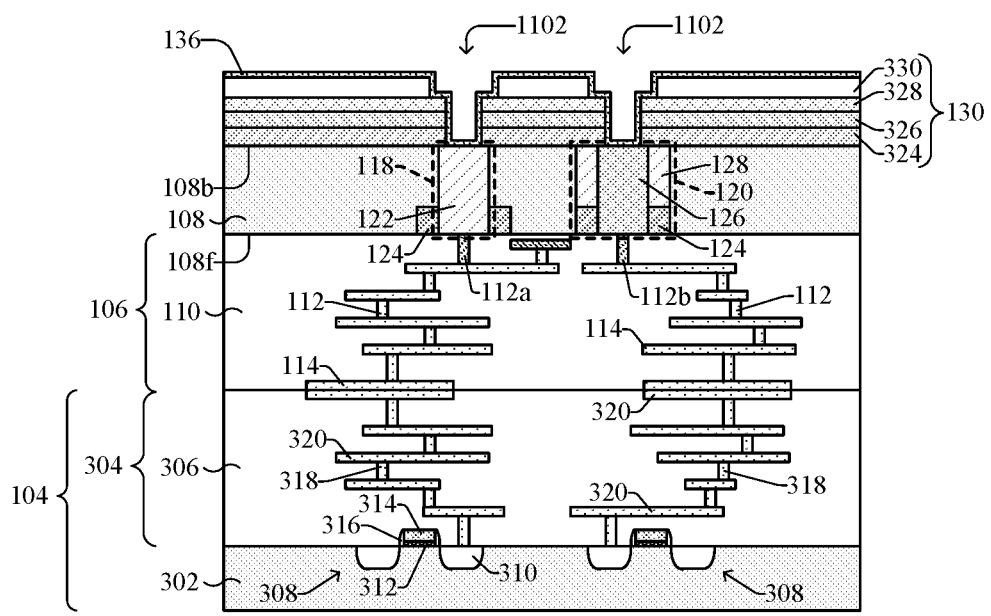

As shown in cross-sectional view 1200 of FIG. 12, a first conductive layer 136 is formed over the upper dielectric structure 130, the first TSV 118, and the second TSV 120. The first conductive layer 136 at least partially fills the contact openings 1102. In some embodiments, the first conductive layer 136 may, for example, be or comprise a conductive material (e.g., nickel) configured to be converted to a silicide of the conductive material with low resistivity (e.g., a resistivity less than about 25 μΩ-cm) when exposed to an annealing process that has temperatures within a range of about 320 to 480 degrees Celsius. In some embodiments, the first conductive layer 136 is in direct contact with the first and/or second TSVs 118, 120. For example, in some embodiments, the first conductive layer 136 may directly contact the first doped channel region 122 and/or the second doped channel region 126. In yet further embodiments, the first conductive layer 136 may be formed by, for example, CVD, PVD, sputtering, electroless plating, electroplating, or another suitable growth or deposition process. In some embodiments, the first conductive layer 136 may comprise a same material (e.g., nickel) as the first and second conductive vias 112a, 112b.

Figure 13:
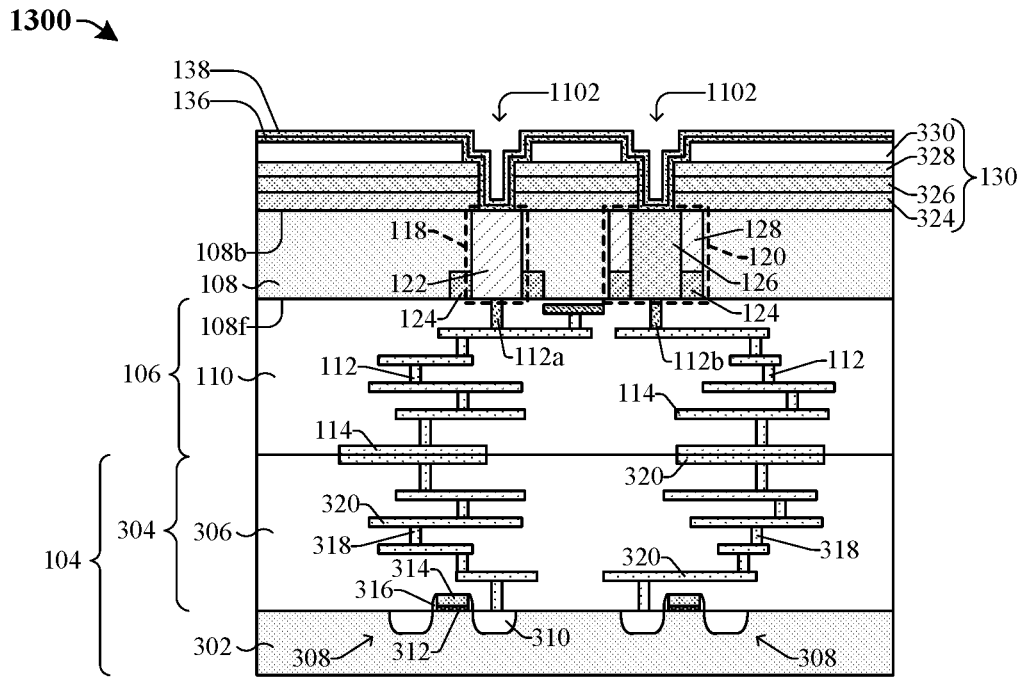

As shown in cross-sectional view 1300 of FIG. 13, a second conductive layer 138 is formed over the first conductive layer 136. The second conductive layer 138 at least partially fills the contact openings 1102. In some embodiments, the second conductive layer 138 may, for example, be or comprise titanium, a nitride, titanium nitride, a combination of the foregoing, or another suitable conductive material. In various embodiments, the second conductive layer 138 comprises a material different than the first conductive layer 136. In yet further embodiments, the second conductive layer 138 may be formed by, for example, CVD, PVD, sputtering, electroless plating, electroplating, or another suitable growth or deposition process.

Figure 14:
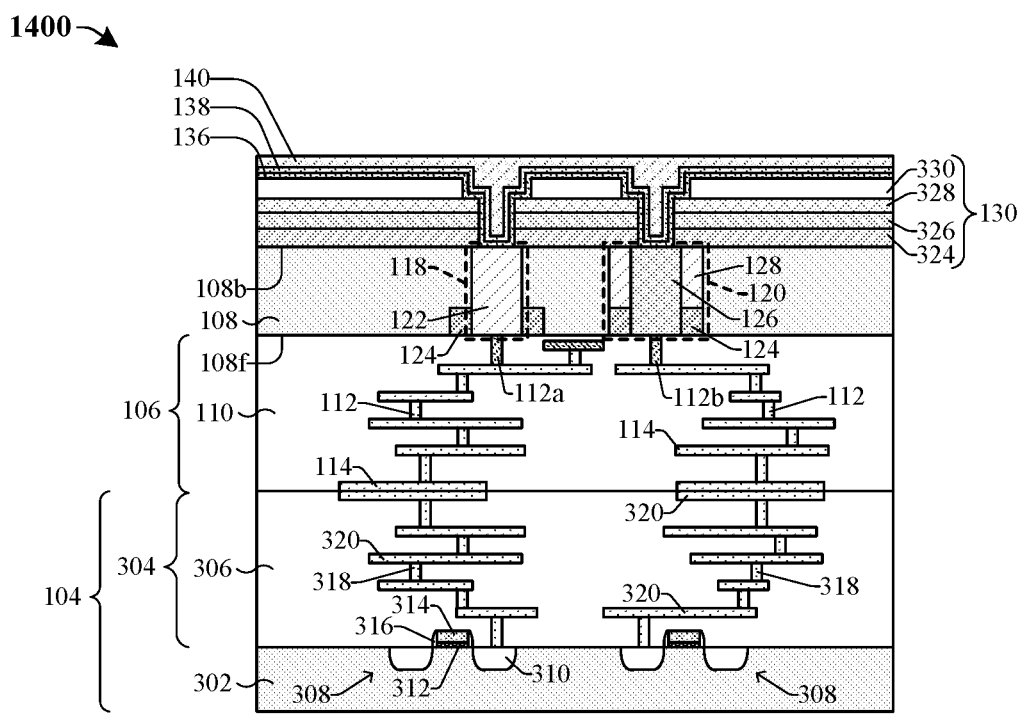

As shown in cross-sectional view 1400 of FIG. 14, a third conductive layer 140 is formed over the second conductive layer 138. In some embodiments, the third conductive layer 140 fills a remaining portion of the contact openings (1102 of FIG. 13). In some embodiments, the third conductive layer 140 may, for example, be or comprise tungsten, or another suitable conductive material. In yet further embodiments, the third conductive layer 140 may comprise a material different than the first conductive layer 136 and/or the second conductive layer 138. In yet further embodiments, the third conductive layer 140 may be formed by, for example, CVD, PVD, sputtering, electroless plating, electroplating, or another suitable growth or deposition process.

Figure 15:
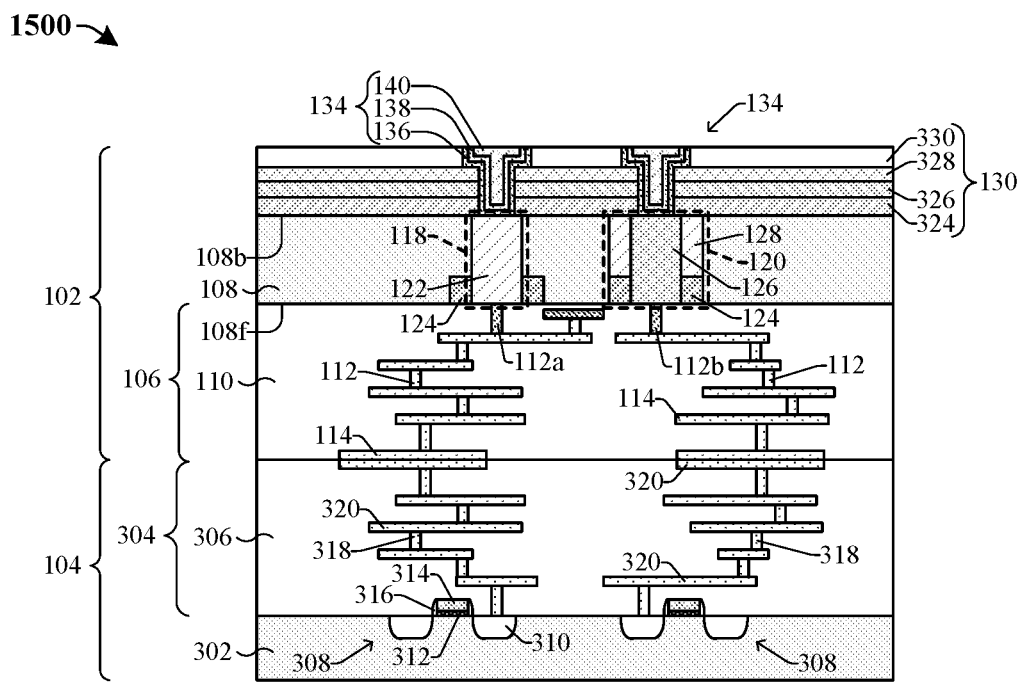

As shown in cross-sectional view 1500 of FIG. 15, a planarization process is performed on the first, second, and third conductive layers 136, 138, 140 until an upper surface of the upper dielectric structure 130 is reached, thereby defining conductive contacts 134 and the first IC die 102. In some embodiments, the planarization process may include performing an etching process, a planarization process (e.g., a CMP process), a combination of the foregoing, or another suitable planarization process.

Figure 16:
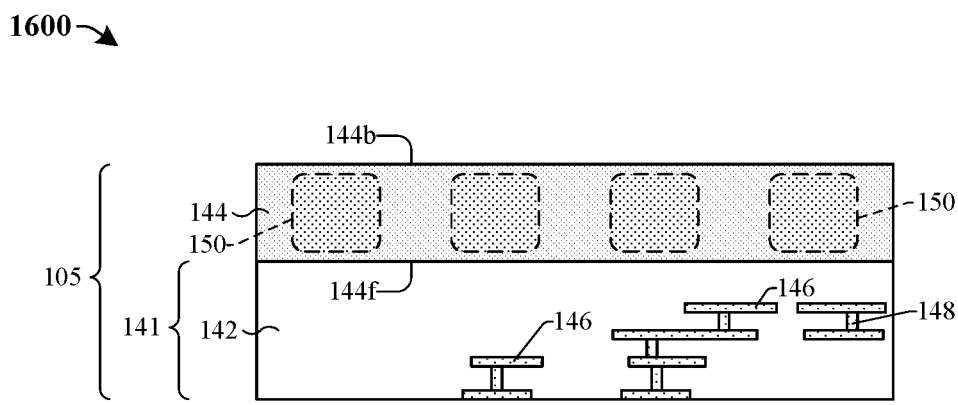

As shown in cross-sectional view 1600 of FIG. 16, a pixel substrate 144 is provided and an upper interconnect structure 141 is formed along a front-side 144f of the pixel substrate 144, thereby defining a pixel IC die 105. In some embodiments, the pixel substrate 144 may, for example, be or comprise a semiconductor substrate material (e.g., silicon), a bulk substrate (e.g., a bulk silicon substrate), a silicon-on-insulator (SOI) substrate, or some other suitable substrate. In some embodiments, before forming the upper interconnect structure 141, an implant process may be performed to dope the pixel substrate 144 with a first doping type (e.g., p-type) to a doping concentration of approximately $1*10^{15}$ atoms/$cm^3$. In yet further embodiments, before forming the upper interconnect structure 141, a selective ion implant process may be performed to form a plurality of photodetectors 150 within the pixel substrate 144, such that the photodetectors 150 comprise the second doping type (e.g., n-type) with a doping concentration greater than the doping concentration of the pixel substrate 144. In some embodiments, the selective ion implant process may include: forming a masking layer (not shown) on the front-side 144f of the pixel substrate 144; selectively implant dopants (e.g., n-type dopants) into the pixel substrate 144 according to the masking layer, thereby defining the photodetectors 150; and performing a removal process to remove the masking layer.

Figure 17:
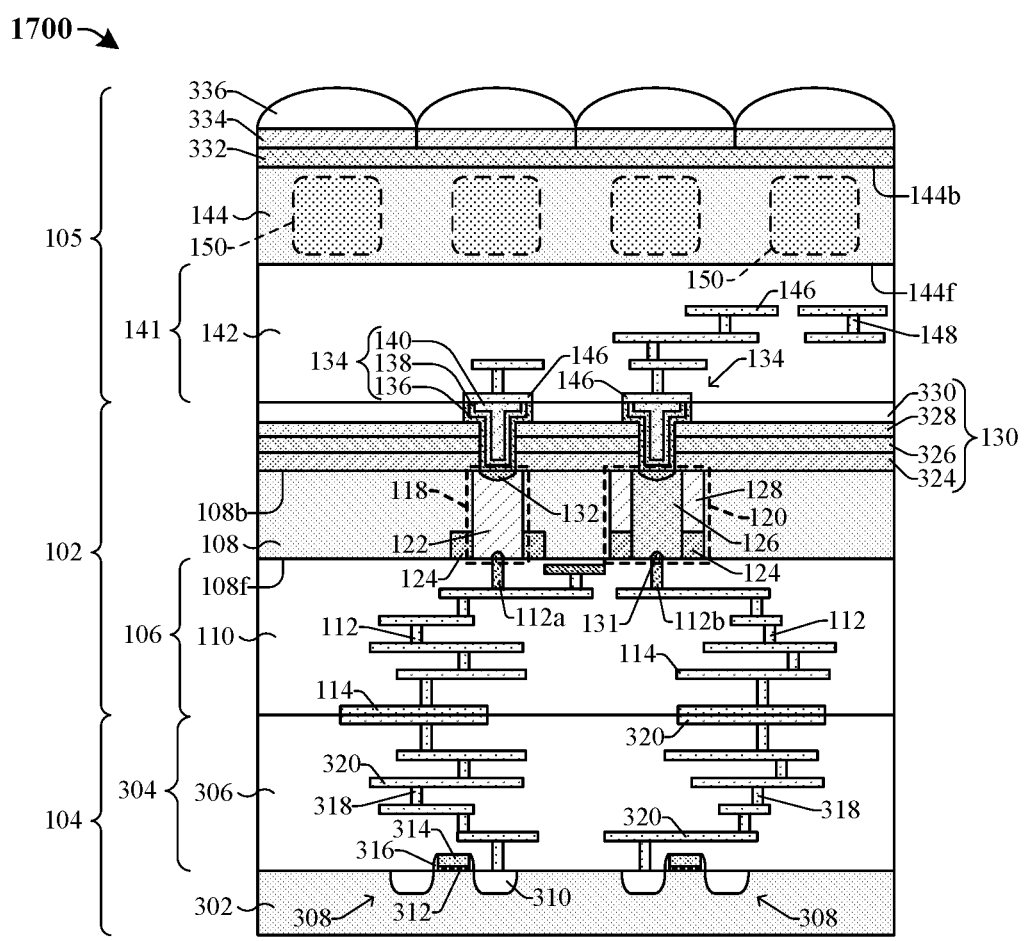

As shown in cross-sectional view 1700 of FIG. 17, the pixel IC die 105 is bonded to the first IC die 102, such that the pixel IC die 105 and the first IC die 102 interface to define a hybrid bond. In some embodiments, the hybrid bond may comprise a dielectric-to-dielectric bond between the upper interconnect dielectric structure 142 and the upper dielectric structure 130. Further, the hybrid bond may comprise a conductor-to-conductor bond between the conductive contacts 134 and conductive layers (e.g., conductive wires 146) within the upper interconnect structure 141. In some embodiments, the process of bonding the pixel IC die 105 to the first IC die 102 may include, for example, a fusion bonding process and/or a metallic bonding process. In yet further embodiments, an anti-reflection layer 332 is formed over a back-side 144b of the pixel substrate 144. In addition, a plurality of color filters 334 are formed over the anti-reflection layer 332, such that a color filter 334 overlies a corresponding photodetector 150. Finally, micro-lenses 336 are formed over the plurality of color filters 334. In some embodiments, the anti-reflection layer 332, the color filters 334, and/or the anti-reflection layer 332 may be formed by, for example, CVD, PVD, ALD, or another suitable deposition or growth process. In some embodiments, the pixel IC die 105 may be configured as the pixel IC die 105 of FIGS. 1, 3A, and/or 4.

In some embodiments, after forming the photodetectors 150 and/or after bonding the pixel IC die 105 to the first IC die 102, an annealing process may be performed on the structure of FIG. 15 or FIG. 17. The annealing process may form an upper conductive layer 132 and a lower conductive layer 131 within the first semiconductor substrate 108. The upper conductive layer 132 may comprise a silicide (e.g., NiSi) of the first conductive layer 136 and the lower conductive layer 131 may comprise a silicide (e.g., NiSi) of the first and/or second conductive vias 112a, 112b. Further, the annealing process is configured to remove impurities from the first semiconductor substrate 108 and/or the pixel substrate 144 due to, for example, the implant process used to form the photodetectors 150. The annealing process may be performed in a hydrogen gas ($H_2$) environment at a temperature within a range of about 280 to 410 degrees Celsius. In such embodiments, the first interconnect structure 106 and/or the conductive contacts 134 are exposed to a reactive species (e.g., hydrogen gas ($H_2$)) during the annealing process. In some embodiments, the first conductive layer 136 and the first and/or second conductive vias 112a, 112b respectively comprise a conductive material (e.g., nickel) configured to form a low resistivity silicide with an adjacent semiconductor substrate material (e.g., silicon) when exposed to temperatures within a range of about 320 to 480 degrees Celsius. Thus, the annealing process is configured to remove impurities from the first semiconductor substrate 108 and/or the pixel substrate 144 while forming the lower and upper conductive layers 131, 132. This in part facilitates the conductive contacts 134 and/or the first and second conductive vias 112a, 112b having a good electrical connection (e.g., an ohmic contact) with a corresponding one of the first and second TSVs 118, 120. By virtue of the annealing process having a maximum temperature of about 410 degrees Celsius, damage to semiconductor devices (e.g., semiconductor devices 308, photodetectors 150, etc.) and/or layers within the first IC die 102, the second IC die 104, and/or the pixel IC die 105 may be mitigated and/or eliminated.

In yet further embodiments, photodetectors (not shown) may be formed within the first semiconductor substrate 108 in a region laterally offset from the first and/or second TSVs 118, 120. In such embodiments, the photodetectors may be formed before and/or after forming the first and second TSVs 118, 120. In yet further embodiments, the photodetectors may be formed after forming the first and/or second TSVs 118, 120, but before bonding the first IC die 102 to the second IC die 104. In such embodiments, the annealing process is performed after forming the photodetectors and the conductive contacts 134 and before bonding another IC die (e.g., the pixel IC die 105) to the first IC die 102. In such embodiments, the lower and/or upper conductive layers 131, 132 are formed before bonding the another IC die to the first IC die 102.

Figure 18:
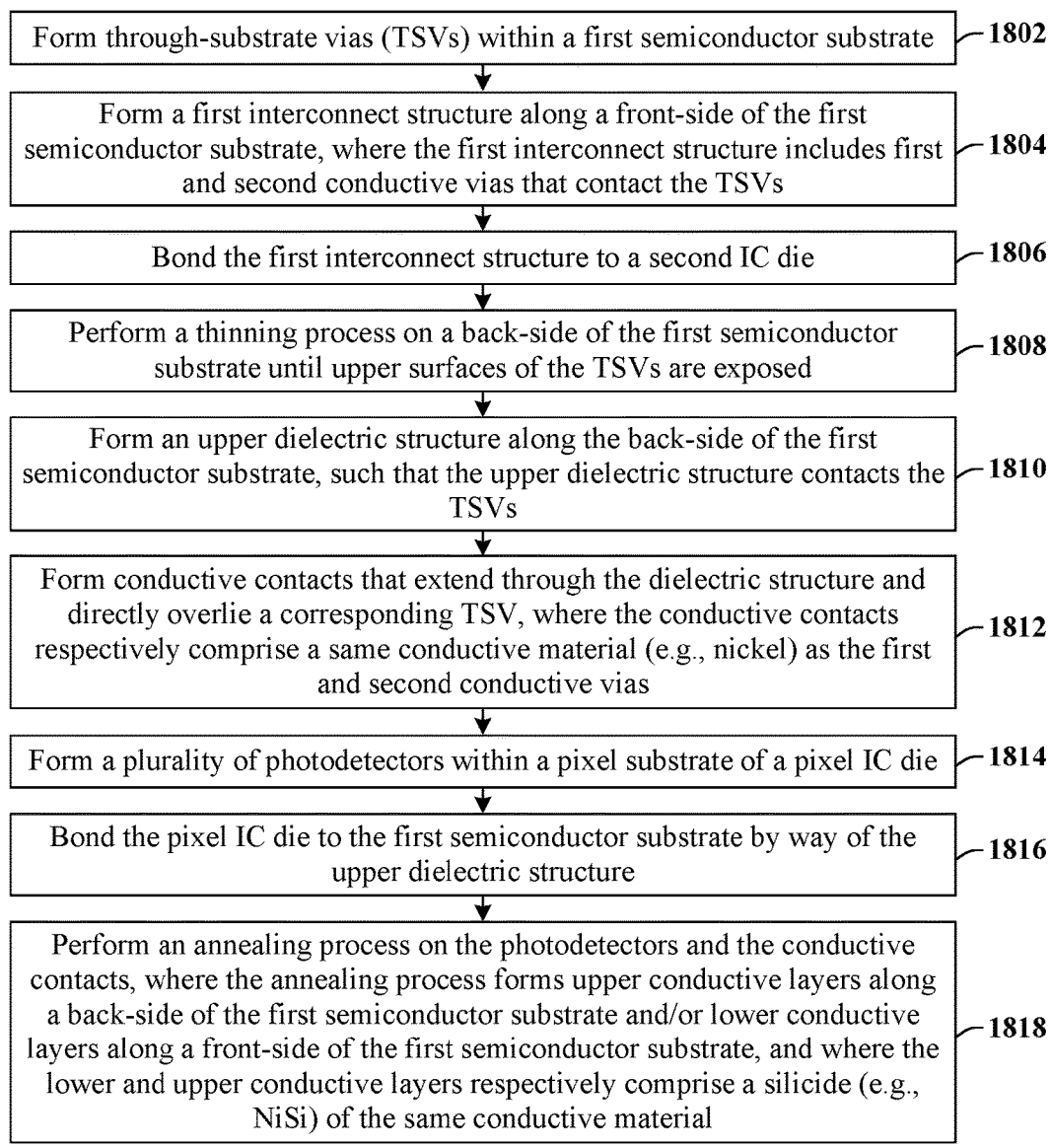
FIG. 18 illustrates a block diagram of some embodiments of a method for forming a 3D IC including a first IC die having ion TSVs and a second IC die having semiconductor devices, where conductive contacts overlie the ion TSVs and upper conductive layers are disposed between the conductive contacts and the ion TSVs.

FIG. 18 illustrates a block diagram of a method 1800 of forming a three-dimensional (3D) integrated circuit (IC) including a first IC die and a second IC die that respectively have ion through-substrate vias (TSVs) and semiconductor devices, where conductive contacts overlie the ion TSVs. Although the method 1800 is illustrated and/or described as a series of acts or events, it will be appreciated that the method is not limited to the illustrated ordering or acts. Thus, in some embodiments, the acts may be carried out in different orders than illustrated, and/or may be carried out concurrently. Further, in some embodiments, the illustrated acts or events may be subdivided into multiple acts or events, which may be carried out at separate times or concurrently with other acts or sub-acts. In some embodiments, some illustrated acts or events may be omitted, and other un-illustrated acts or events may be included.

At act 1802, through-substrate vias (TSVs) are formed within a first semiconductor substrate. FIGS. 5 and 6 illustrate cross-sectional views 500 and 600 corresponding to some embodiments of act 1802.

At act 1804, a first interconnect structure is formed along a front-side of the first semiconductor substrate. The first interconnect structure includes first and second conductive vias that contact the TSVs. FIG. 7 illustrates a cross-sectional view 700 corresponding to some embodiments of act 1804.

At act 1806, the first interconnect structure is bonded to a second IC die. FIG. 8 illustrates a cross-sectional view 800 corresponding to some embodiments of act 1806.

At act 1808, a thinning process is performed on a back-side of the first semiconductor substrate until upper surfaces of the TSVs are exposed. FIG. 9 illustrates a cross-sectional view 900 corresponding to some embodiments of act 1808.

At act 1810, an upper dielectric structure is formed along the back-side of the first semiconductor substrate, such that the upper dielectric structure contacts the TSVs. FIG. 10 illustrates a cross-sectional view 1000 corresponding to some embodiments of act 1810.

At act 1812, conductive contacts are formed over a corresponding TSV, such that the conductive contacts extend through the upper dielectric structure. The conductive contacts respectively comprise a same conductive material (e.g., nickel) as the first and second conductive vias. FIGS. 12-15 illustrate cross-sectional views 1200-1500 corresponding to some embodiments of act 1812.

At act 1814, a plurality of photodetectors are formed within a pixel substrate of a pixel IC die. FIG. 16 illustrates a cross-sectional view 1600 corresponding to some embodiments of act 1814.

At act 1816, the pixel IC die is bonded to the first semiconductor substrate by way of the upper dielectric structure. FIG. 17 illustrates a cross-sectional view 1700 corresponding to some embodiments of act 1816.

At act 1818, an annealing process is performed on the photodetectors and the conductive contacts. The annealing process forms upper conductive layers along a back-side of the first semiconductor substrate and/or lower conductive layers along a front-side of the first semiconductor substrate. The lower and upper conductive layers respectively comprise a silicide (e.g., NiSi) of the same conductive material. FIG. 17 illustrates a cross-sectional view 1700 corresponding to some embodiments of act 1818.

Accordingly, in some embodiments, the present disclosure relates to an integrated circuit (IC) including an ion through-substrate via (TSV) extending from a front-side surface of a semiconductor substrate to a back-side surface of the semiconductor substrate. A conductive contact overlies the ion TSV and an upper conductive layer is disposed between the ion TSV and the conductive contact. The conductive contact comprises a conductive material and the ion TSV comprises a semiconductor material. The upper conductive layer comprises a silicide of the conductive material and the semiconductor material.

In some embodiments, the present application provides an integrated chip including a semiconductor substrate having a front-side surface and a back-side surface respectively on opposite sides of the semiconductor substrate, wherein the semiconductor substrate includes a first doped channel region extending from the front-side surface to the back-side surface; a first through substrate via (TSV) defined at least by the first doped channel region; a conductive contact overlying the back-side surface of the semiconductor substrate, wherein the conductive contact includes a first conductive layer overlying the first TSV, wherein the first conductive layer comprises a conductive material; and an upper conductive layer underlying the conductive contact, wherein an upper surface of the upper conductive layer is aligned with the back-side surface of the semiconductor substrate, and wherein the upper conductive layer comprises a silicide of the conductive material.

In some embodiments, the present application provides an integrated circuit (IC) including a first IC die including a first semiconductor substrate and a first interconnect structure underlying the first semiconductor substrate, wherein the first interconnect structure includes a plurality of first conductive wires, wherein the first conductive wires respectively comprise a first conductive material; a second IC die under the first IC die, wherein the second IC die includes a second semiconductor substrate and a second interconnect structure overlying the second semiconductor substrate; and wherein the first and second IC dies contact at a bond interface between the first and second interconnect structures; a plurality of semiconductor devices on the second semiconductor substrate; a first through-substrate via (TSV) within the first semiconductor substrate and electrically coupled to the second interconnect structure through the first interconnect structure, wherein the first TSV and the first semiconductor substrate are comprised of a semiconductor material; a first conductive contact overlying the first semiconductor substrate, wherein the first conductive contact comprises a second conductive material different from the first conductive material; and a first upper conductive layer disposed between the first conductive contact and the first TSV, wherein the first upper conductive layer comprises a third conductive material different from the first and second conductive materials, respectively.

In some embodiments, the present application provides a method for forming an integrated circuit (IC), the method including performing a first ion implant process into a front-side surface of a first semiconductor substrate to form a first doped channel region extending into the first semiconductor substrate from the front-side surface, wherein the first semiconductor substrate comprises a semiconductor material; forming a first interconnect structure along the front-side surface of the first semiconductor substrate; thinning the first semiconductor substrate from a back-side surface of the first semiconductor substrate until the first doped channel region is exposed, wherein the back-side surface is opposite the front-side surface; forming a conductive contact overlying and electrically coupled to the first doped channel region on the back-side surface of the first semiconductor substrate, wherein the conductive contact comprises a conductive material; and performing an annealing process to form an upper conductive layer within the first semiconductor substrate, wherein the upper conductive layer comprises a silicide of the semiconductor material and the conductive material.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. An integrated chip comprising:
a semiconductor substrate having a front-side surface and a back-side surface respectively on opposite sides of the semiconductor substrate, wherein the semiconductor substrate comprises a first doped channel region extending from the front-side surface to the back-side surface;
a first through substrate via (TSV) defined at least by the first doped channel region;
a conductive contact overlying the back-side surface of the semiconductor substrate, wherein the conductive contact comprises a first conductive layer overlying the first TSV, wherein the first conductive layer comprises a conductive material; and
an upper conductive layer underlying the conductive contact, wherein an upper surface of the upper conductive layer is aligned with the back-side surface of the semiconductor substrate, and wherein the upper conductive layer comprises a silicide of the conductive material.

2. The integrated chip of claim 1, wherein the conductive material is nickel (Ni) and the silicide is nickel silicide (NiSi).

3. The integrated chip of claim 1, wherein the upper conductive layer directly contacts the first conductive layer and directly contacts the first doped channel region.

4. The integrated chip of claim 1, wherein the first doped channel region laterally encloses the upper conductive layer and cups a lower surface of the upper conductive layer.

5. The integrated chip of claim 1, wherein the conductive contact further comprises:
a second conductive layer extending along an upper surface of the first conductive layer; and
a third conductive layer extending along an upper surface of the second conductive layer, wherein the second conductive layer is disposed between the first and third conductive layers, and wherein the first, second, and third conductive layers respectively comprise a material different from one another.

6. The integrated chip of claim 1, further comprising:
an interconnect structure disposed along the front-side surface of the semiconductor substrate, wherein the interconnect structure comprises a plurality of conductive wires and a plurality of conductive vias, wherein the conductive wires and vias define a conductive path to the first TSV, wherein the conductive vias comprise a first conductive via that is laterally spaced between sidewalls of the first TSV and comprises the conductive material.

7. The integrated chip of claim 6, further comprising:
a lower conductive layer overlying the first conductive via, wherein a lower surface of the lower conductive layer is aligned with the front-side surface of the semiconductor substrate, and wherein the lower conductive layer comprises the silicide of the conductive material.

8. The integrated chip of claim 7, wherein the lower conductive layer directly contacts the first doped channel region and directly contacts the first conductive via.

9. The integrated chip of claim 1, wherein a resistivity of the upper conductive layer is within a range of about 5 to 25 μΩ-cm.

10. An integrated circuit (IC) comprising:
a first IC die comprising a first semiconductor substrate and a first interconnect structure underlying the first semiconductor substrate, wherein the first interconnect structure comprises a plurality of first conductive wires, wherein the first conductive wires respectively comprise a first conductive material;
a second IC die under the first IC die, wherein the second IC die comprises a second semiconductor substrate and a second interconnect structure overlying the second semiconductor substrate; and wherein the first and second IC dies contact at a bond interface between the first and second interconnect structures;
a plurality of semiconductor devices on the second semiconductor substrate;
a first through-substrate via (TSV) within the first semiconductor substrate and electrically coupled to the second interconnect structure through the first interconnect structure, wherein the first TSV and the first semiconductor substrate are comprised of a semiconductor material;

a first conductive contact overlying the first semiconductor substrate, wherein the first conductive contact comprises a second conductive material different from the first conductive material; and a first upper conductive layer disposed between the first conductive contact and the first TSV, wherein the first upper conductive layer comprises a third conductive material different from the first and second conductive materials, respectively.

11. The IC according to claim 10, wherein the third conductive material comprises a silicide of the semiconductor material and the second conductive material.

12. The IC according to claim 10, wherein the first conductive material comprises copper (Cu) and/or aluminum (Al), the second conductive material comprises nickel (Ni), the third conductive material comprises nickel silicide (NiSi), and the semiconductor material comprises silicon (Si).

13. The IC according to claim 10, wherein the first TSV comprises an inner region surrounded by an outer region, wherein the inner region comprises a first doping type and the outer region comprises a second doping type opposite the first doping type, wherein the first conductive contact is disposed laterally between opposing sidewalls of the inner region.

14. The IC according to claim 13, wherein the first upper conductive layer is disposed between the opposing sidewalls of the inner region, wherein the first upper conductive layer is laterally offset from the outer region by a non-zero distance.

15. The IC according to claim 10, further comprising:
a pixel IC die overlying the first IC die, wherein the pixel IC die comprises a pixel substrate and an upper interconnect structure disposed along a front-side surface of the pixel substrate;
a plurality of photodetectors disposed within the pixel substrate, wherein the plurality of photodetectors comprise a first doping type; and
wherein the first TSV comprises a doped channel region, wherein the doped channel region extends from a bottom surface of the first semiconductor substrate to a top surface of the first semiconductor substrate, and wherein the doped channel region comprises the first doping type.

16. The IC according to claim 10, further comprising:
a second TSV within the first semiconductor substrate and electrically coupled to the second interconnect structure through the first interconnect structure, wherein the second TSV comprises the semiconductor material, wherein the second TSV comprises a first doped channel region comprising a first doping type;
a second conductive contact overlying the second TSV, wherein the second conductive contact comprises the second conductive material;
a second upper conductive layer disposed between the second TSV and the second conductive contact, wherein the second upper conductive layer comprises the third conductive material and is disposed laterally between sidewalls of the first doped channel region; and
wherein the first TSV comprises an inner region laterally surrounded by an outer region, wherein the inner region comprises a second doping type and the outer region comprises the first doping type, wherein the first doping type is opposite the second doping type, and wherein the first upper conductive layer is spaced laterally between sidewalls of the inner region.

17. An integrated chip comprising:
a semiconductor substrate having a front-side surface opposite a back-side surface;
a through substrate via (TSV) disposed within the semiconductor substrate, wherein the TSV comprises a first doped channel region;
an interconnect structure disposed along the back-side surface of the semiconductor substrate, wherein the interconnect structure comprises a plurality of conductive structures electrically coupled to the TSV; and
an upper conductive layer underlying the interconnect structure and disposed within the semiconductor substrate, wherein the upper conductive layer abuts the first doped channel region.

18. The integrated chip of claim 17, wherein the first doped channel region continuously extends from opposing sidewalls of the upper conductive layer to a bottom surface of the upper conductive layer.

19. The integrated chip of claim 18, wherein a top surface of the first doped channel region and a top surface of the upper conductive layer are respectively aligned with the back-side surface of the semiconductor substrate.

20. The integrated chip of claim 17, wherein the conductive structures of the interconnect structure are electrically coupled to the TSV by way of a conductive contact and the upper conductive layer, wherein the conductive contact is disposed between the interconnect structure and the back-side surface of the semiconductor substrate.

* * * * *